(12) United States Patent
Ushiro

(10) Patent No.: US 12,409,795 B2
(45) Date of Patent: Sep. 9, 2025

(54) POWER SUPPLY CONTROL DEVICE, IN-VEHICLE CONTROL DEVICE, AND POWER SUPPLY CONTROL METHOD

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Shota Ushiro, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 175 days.

(21) Appl. No.: 18/250,655

(22) PCT Filed: Oct. 18, 2021

(86) PCT No.: PCT/JP2021/038412
§ 371 (c)(1),
(2) Date: Apr. 26, 2023

(87) PCT Pub. No.: WO2022/091837
PCT Pub. Date: May 5, 2022

(65) Prior Publication Data
US 2024/0001873 A1 Jan. 4, 2024

(30) Foreign Application Priority Data

Oct. 28, 2020 (JP) ................. 2020-180894

(51) Int. Cl.
*B60R 16/03* (2006.01)
*B60R 16/023* (2006.01)
(Continued)

(52) U.S. Cl.
CPC .......... *B60R 16/0232* (2013.01); *B60R 16/03* (2013.01); *G01R 19/003* (2013.01); *G01R 31/007* (2013.01)

(58) Field of Classification Search
CPC . B60R 16/0232; B60R 16/03; B60R 16/0207; G01R 31/007; G01R 19/003; G01R 31/2874; G01R 31/2879
See application file for complete search history.

(56) References Cited

U.S. PATENT DOCUMENTS 5,898,557 A * 4/1999 Baba ................... H03K 17/18
361/103
10,166,939 B2 * 1/2019 Nakamura ............... G01K 7/42
(Continued)

FOREIGN PATENT DOCUMENTS

JP 2000-016200 A 1/2000

OTHER PUBLICATIONS

International Search Report, Application No. PCT/JP2021/038412, mailed Dec. 28, 2021. ISA/Japan Patent Office.

*Primary Examiner* — Thai T Dinh
(74) *Attorney, Agent, or Firm* — Honigman LLP

(57) ABSTRACT

An individual ECU controls power supply through a wire W. A microcomputer of the individual ECU increases an average value of a wire current value of a current flowing through the wire W in a stepwise manner. The microcomputer determines, every time that the average value of a wire current value is increased, whether or not an anomaly has occurred in power supply through the wire (W) based on a temperature difference between a wire temperature of the wire (W) and an environmental temperature in an area surrounding the wire (W).

16 Claims, 11 Drawing Sheets

(51) Int. Cl.
  *G01R 19/00* (2006.01)
  *G01R 31/00* (2006.01)

(56) References Cited

U.S. PATENT DOCUMENTS

| | | | |
|---|---|---|---|
| 10,259,407 B2* | 4/2019 | Iwasaki | B60R 16/03 |
| 11,940,334 B2* | 3/2024 | Sawano | G01K 7/22 |
| 2018/0294635 A1* | 10/2018 | Kozuki | H02H 3/085 |
| 2019/0165564 A1* | 5/2019 | Fuseya | H02H 5/047 |
| 2019/0312501 A1* | 10/2019 | Yamada | H02M 1/08 |
| 2021/0325259 A1* | 10/2021 | Sawano | B60R 16/02 |
| 2021/0391788 A1 | 12/2021 | Sawano et al. | |
| 2022/0045502 A1 | 2/2022 | Sawano et al. | |

\* cited by examiner

FIG. 5

Temperature Difference Table  Q1

| Duty Ratio | A |
|---|---|
| 10% | ... |
| 20% | ... |
| 30% | ... |
| ⋮ | ⋮ |
| 100% | ... |

LEGEND
A= Upper Limit Values Of Temperature Difference

FIG. 6

Increasing Amount Table  Q2

| A | B |
|---|---|
| 0%→10% | ... |
| 10%→20% | ... |
| 20%→30% | ... |
| ⋮ | ⋮ |
| 90%→100% | ... |

LEGEND
A= Amount Of Increase In Duty Ratio
B= Upper Limit Values Of Amount Of Increase In Temperature Difference

POWER SUPPLY CONTROL DEVICE, IN-VEHICLE CONTROL DEVICE, AND POWER SUPPLY CONTROL METHOD

CROSS-REFERENCE TO RELATED APPLICATIONS

This application is the U.S. national stage of PCT/JP2021/038412 filed on Oct. 18, 2021, which claims priority of Japanese Patent Application No. JP 2020-180894 filed on Oct. 28, 2020, the contents of which are incorporated herein.

TECHNICAL FIELD

The present disclosure relates to a power supply control device, an in-vehicle control device, and a power supply control method.

BACKGROUND

JP 2000-16200A discloses a power supply control device for a vehicle that controls power supply to a load. In this power supply control device, an FET (Field Effect Transistor) serving as a switch is disposed on a current path of a current flowing through the load. The power supply to the load is controlled by switching the FET on or off. When the temperature of the FET has increased to a temperature that is a predetermined temperature or more, while the FET is on, the FET is forcibly switched off. Accordingly, the temperature of the FET is prevented from increasing to an abnormal temperature.

In a known power supply control device as described in JP 2000-16200A, when a cut-off condition for forcibly cutting off the current flow to a load is satisfied, the FET is forcibly switched off. When power supply to the load is started after the cut-off condition has been satisfied, the FET is again switched on, and the FET is kept on. When the FET is kept on in a state in which the factor that caused the cut-off condition to be satisfied is not resolved, the cut-off condition is satisfied again, and as a result, the FET is forcibly switched off again.

The state in which the cut-off condition is satisfied is a state in which the current value of a current flowing through the FET is large, and is not preferable for the components that constitute the power supply control device. Therefore, an anomaly in the power supply needs to be detected while the current value is small.

SUMMARY

The present disclosure aims to provide a power supply control device, an in-vehicle control device, and a power supply control method with which an anomaly in the power supply can be detected while the current value is small.

A power supply control device according to one aspect of the present disclosure is a power supply control device that controls power supply through a wire, including a processing unit configured to execute processing, wherein the processing unit increases an average value of a wire current value of a current flowing through the wire in a stepwise manner, and every time that the average value of a wire current value is increased, determines whether or not an anomaly occurs in power supply through the wire based on a temperature difference between a wire temperature of the wire and an environmental temperature in an area surrounding the wire.

An in-vehicle control device according to one aspect of the present disclosure is an in-vehicle control device that controls operations of a load, including: a receiving unit configured to receive instruction data instructing that the load be caused to start or stop operating; and a processing unit configured to execute processing, wherein the processing unit controls power supply to the load through a wire in accordance with instruction data received by the receiving unit, increases an average value of a wire current value of a current flowing through the wire in a stepwise manner, and determines, every time the average value of a wire current value is increased, whether or not an anomaly occurs in power supply through the wire, based on a temperature difference between a wire temperature of the wire and an environmental temperature in an area surrounding the wire.

A power supply control method according to one aspect of the present disclosure is a power supply control method of controlling power supply through a wire that includes steps to be executed by a computer, the method including: a step of increasing, in a stepwise manner, an average value of a wire current value of a current flowing through the wire; and a step of determining, every time the average value of a wire current value is increased, whether or not an anomaly occurs in power supply through the wire, based on a temperature difference between a wire temperature of the wire and an environmental temperature in an area surrounding the wire.

Note that the present disclosure can be realized not only as a power supply control device that includes such characteristic processing units, but also as a power supply control method that includes the characteristic processing as steps, or as a computer program for causing a computer to execute these steps. Also, the present disclosure can be realized as a semiconductor integrated circuit that realizes all or part of the power supply control device, or as a power supply control system that includes the power supply control device.

Advantageous Effects of Disclosure

According to the present disclosure, an anomaly in a power supply can be detected before the cut-off condition for cutting off the power supply is satisfied.

BRIEF DESCRIPTION OF DRAWINGS

FIG. 5 is a diagram illustrating content of a temperature difference table.

FIG. 6 is a diagram illustrating content of an increasing amount table.

DETAILED DESCRIPTION OF PREFERRED EMBODIMENTS

Figure 1:
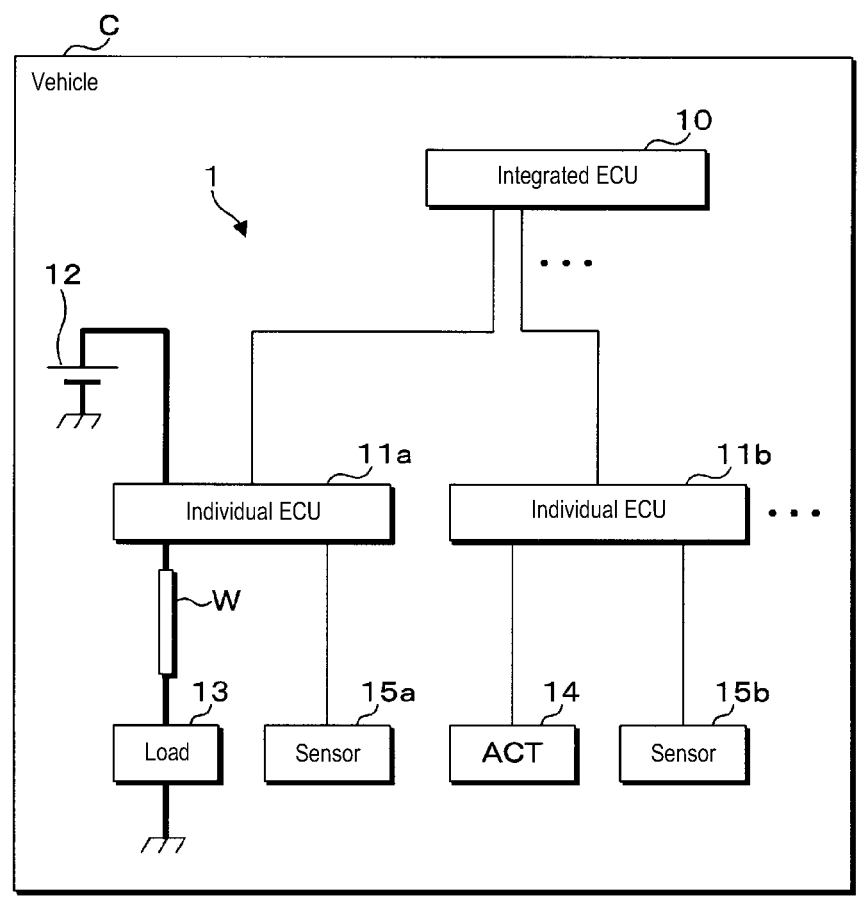
FIG. 1 is a block diagram illustrating the main configuration of a control system 1 in a first embodiment.

First, modes for carrying out the disclosure will be enumerated and described. At least some of the modes described below may be combined as necessary.

First Aspect

In accordance with a first aspect, a power supply control device according to one aspect of the present disclosure is a power supply control device that controls power supply through a wire, and includes a processing unit configured to execute processing, wherein the processing unit increases an average value of a wire current value of a current flowing through the wire in a stepwise manner, and every time that the average value of a wire current value is increased, determines whether or not an anomaly has occurred in power supply through the wire based on a temperature difference between a wire temperature of the wire and an environmental temperature in an area surrounding the wire.

Second Aspect

In a second aspect, in the power supply control device according to one aspect of the present disclosure, the processing unit acquires the wire current value, calculates the temperature difference based on the acquired wire current value, and every time that the average value of the wire current value is increased, determines whether or not the anomaly has occurred based on a calculated temperature difference.

Third Aspect

In a third aspect, the power supply control device according to one aspect of the present disclosure further includes: a switch disposed on a current path of current flowing through the wire; and a switching circuit configured to switch the switch on or off, wherein the processing unit causes the switching circuit to perform PWM control in which the switch is alternately switched on and off, and increases the average value of a wire current value in a stepwise manner by increasing a duty ratio in the PWM control in a stepwise manner.

Fourth Aspect

In a fourth aspect, the power supply control device according to one aspect of the present disclosure further includes: a storage unit that stores a plurality of upper limit values for the temperature difference in association with a plurality of duty ratios regarding the PWM control, wherein the processing unit determines, every time the average value of a wire current value is increased, whether or not the anomaly occurs, based on whether or not the temperature difference exceeds an upper limit value associated with a duty ratio in the PWM control performed by the switching circuit.

Fifth Aspect

In a fifth aspect, in the power supply control device according to one aspect of the present disclosure, the processing unit determines, every time the average value of a wire current value is increased, whether or not the anomaly has occurred, based on the amount of increase in the temperature difference that has increased due to the increase in the average value of a wire current value.

Sixth Aspect

In a sixth aspect, the power supply control device according to one aspect of the present disclosure further includes: a switch to be disposed on a current path of current flowing through the wire; and a switching circuit configured to switch the switch on or off, wherein the switching circuit receives a signal, the switching circuit switches the switch on or off according to the received signal, the switching circuit, if the wire current value is a current threshold or more, or if the temperature of the switch is a switch temperature threshold or more, switches the switch off irrelevant to the received signal, and the processing unit increases the average value of a wire current value in a stepwise manner, after the switching circuit has switched the switch off irrelevant to the received signal.

Seventh Aspect

In a seventh aspect, in the power supply control device according to one aspect of the present disclosure, the processing unit cuts off a flow of current flowing through the wire, when the wire temperature is a wire temperature threshold or more, and increases the average value of a wire current value in a stepwise manner, after the wire temperature has increased to a temperature that is the wire temperature threshold or more.

Eighth Aspect

In an eighth aspect, an in-vehicle control device according to one aspect of the present disclosure is an in-vehicle control device that controls operations of a load, and includes: a receiving unit configured to receive instruction data instructing that the load be caused to start or stop operating; and a processing unit configured to execute processing, wherein the processing unit controls power supply to the load through a wire in accordance with instruction data received by the receiving unit, increases an average value of a wire current value of a current flowing through the wire in a stepwise manner, and determines, every time the average value of a wire current value is increased, whether or not an anomaly has occurred in power supply through the wire, based on a temperature difference between a wire temperature of the wire and an environmental temperature in an area surrounding the wire.

Ninth Aspect

In a ninth aspect, a power supply control method according to one aspect of the present disclosure is a power supply control method of controlling power supply through a wire that includes steps to be executed by a computer, and the method includes: a step of increasing, in a stepwise manner, an average value of a wire current value of a current flowing through the wire; and a step of determining, every time the average value of a wire current value is increased, whether or not an anomaly has occurred in power supply through the wire, based on a temperature difference between a wire temperature of the wire and an environmental temperature in an area surrounding the wire.

In the power supply control device, in-vehicle control device, and power supply control method according to one aspect described above, an average value of a wire current value (average wire current value) in a given period is increased in a stepwise manner. Every time the average wire current value is increased, whether or not an anomaly has occurred in power supply is determined based on a temperature difference between the wire temperature and the environmental temperature. Therefore, an anomaly in power supply can be detected while a current value is small.

In the power supply control device according to one aspect described above, the temperature difference between the wire temperature and the environmental temperature is calculated based on a wire current value. The calculated temperature difference is used to determine whether or not an anomaly has occurred in power supply.

In the power supply control device according to one aspect described above, the average wire current value is increased in a stepwise manner by increasing the duty ratio in PWM control performed on a switch in a stepwise manner. Therefore, the average wire current value can be easily increased in a stepwise manner.

In the power supply control device according to one aspect described above, determination as to whether or not an anomaly has occurred in power supply is made based on a comparison between the temperature difference and the upper limit value associated with the duty ratio in PWM control actually performed by the switching circuit.

In the power supply control device according to one aspect described above, determination as to whether or not an anomaly has occurred in power supply is made based on the amount of increase in the temperature difference caused by the increase in duty ratio in PWM control.

In the power supply control device according to one aspect described above, the switching circuit forcibly switches off the switch based on a wire current value or a switch temperature. After the switching circuit forcibly switches off the switch, the average wire current value is increased in a stepwise manner, and whether or not an anomaly has occurred in power supply is determined.

In the power supply control device according to one aspect described above, when the wire temperature has increased to a temperature that is the wire temperature threshold or more, the current flow through the wire is forcibly cut off. After the current flow is forcibly cut off, the average wire current is increased in a stepwise manner, and whether or not an anomaly has occurred in power supply is determined.

Specific examples of a control system according to embodiments of the disclosure will be described below with reference to the drawings. Note that the present disclosure is not limited to these illustrative examples and is defined by the claims, and all changes that come within the meaning and range of equivalency of the claims are intended to be embraced therein.

First Embodiment

Configuration of Control System

FIG. 1 is a block diagram illustrating the main configuration of a control system 1 in a first embodiment. The control system 1 is mounted in a vehicle C. The control system 1 includes an integrated ECU 10, an individual ECU 11a, a plurality of individual ECUs 11b, a DC power supply 12, a load 13, an actuator 14, and two sensors 15a and 15b. The DC power supply 12 is a battery, for example. In FIG. 1, interconnect lines for supplying power are shown with thick lines. Interconnect lines through which data or signals propagates are shown with thin lines.

The integrated ECU 10 is connected to the individual ECU 11a and the plurality of individual ECUs 11b. The individual ECU 11a is connected to a positive electrode of the DC power supply 12 and one end of a wire W. The other end of the wire W is connected to one end of the load 13. A negative electrode of the DC power supply 12 and the other end of the wire W are grounded. The sensor 15a is also connected to the individual ECU 11a. The actuator 14 and the sensor 15b are connected to each individual ECU 11b.

The DC power supply 12 supplies power to the individual ECU 11a, and also supplies power to the load 13 through the wire W. The individual ECU 11a controls power supply to the load 13 through the wire W. The individual ECU 11a functions as a power supply control device. The load 13 is an electrical device such as a lamp or a motor. When power is supplied to the load 13, the load 13 starts operating. When power supply to the load 13 stops, the load 13 stops operating. The individual ECU 11a controls operations of the load 13 by controlling the power supply to the load 13. The individual ECU 11a also functions as an in-vehicle control device.

The actuator 14 is also an electrical device. The individual ECU 11b outputs a control signal indicating operations to be performed by the actuator 14 to the actuator 14. Upon receiving a control signal, the actuator 14 performs operations indicated by the received control signal.

The sensors 15a and 15b repeatedly generate vehicle data regarding the vehicle C. The vehicle data is image data obtained by capturing a surrounding area of the vehicle C, data indicating the speed of the vehicle C, data indicating whether or not a switch mounted on the vehicle C is on, or the like. Every time the sensor 15a generates vehicle data, the sensor 15a outputs the generated vehicle data to the individual ECU 11a. Similarly, every time the sensor 15b generates vehicle data, the sensor 15b outputs the generated vehicle data to the individual ECU 11b. Every time the individual ECUs 11a and 11b receive vehicle data, the individual ECUs 11a and 11b transmit the received vehicle data to the integrated ECU 10.

The integrated ECU 10 determines the operations of the load 13 based on one or more pieces of vehicle data received from at least one of the individual ECU 11a and the plurality of individual ECUs 11b. Here, the operations of the load 13 to be determined are to start operating or to stop operating. Upon determining the operations of the load 13, the integrated ECU 10 transmits instruction data for instructing the determined operations to the individual ECU 11a. Upon receiving instruction data from the integrated ECU 10, the individual ECU 11a causes the load 13 to perform the operations as instructed by the received instruction data.

Similarly, the integrated ECU 10 determines the operations of one or more actuators 14 based on one or more pieces of vehicle data received from at least one of the individual ECU 11a and the plurality of individual ECUs 11b. Upon determining the operations of the one or more actuators 14, the integrated ECU 10 transmits instruction data for instructing the determined operations to the corresponding one or more individual ECUs 11b. Upon receiving instruction data from the integrated ECU 10, the individual ECU 11b outputs a control signal to the actuator 14 connected to the individual ECU 11b. The operations indicated by the control signal are operations instructed by the instruction data received by the individual ECU 11b. As mentioned above, the actuator 14 performs operations indicated by the received control signal.

Configuration of Individual ECU 11a

Figure 2:
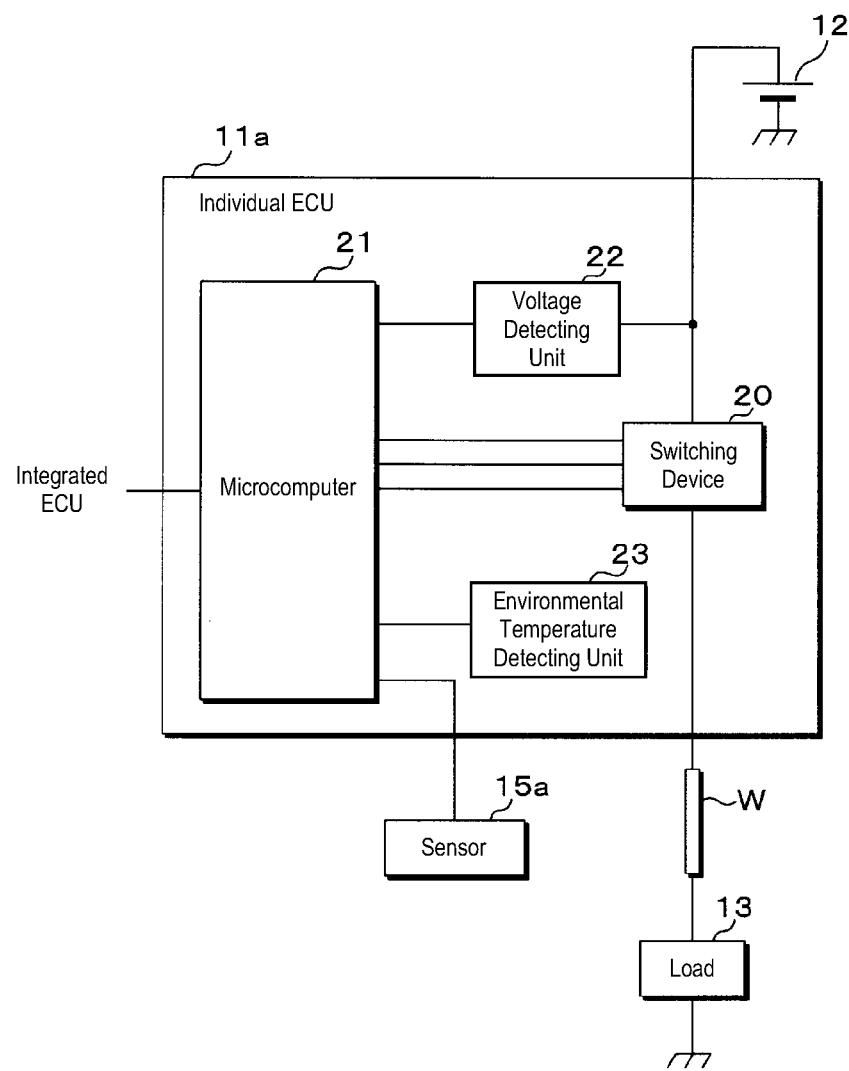
FIG. 2 is a block diagram illustrating the main configuration of an individual ECU.

FIG. 2 is a block diagram illustrating the main configuration of the individual ECU 11a. The individual ECU 11a includes a switching device 20, a microcomputer 21, a voltage detecting unit 22, and an environmental temperature detecting unit 23. The switching device 20 is connected between the positive electrode of the DC power supply 12 and one end of the wire W. The switching device 20 is also connected to the microcomputer 21. The voltage detecting unit 22 is connected to the positive electrode of the DC power supply 12. The voltage detecting unit 22 and the environmental temperature detecting unit 23 are separately connected to the microcomputer 21. The microcomputer 21 is also connected to the integrated ECU 10 and the sensor 15a.

Figure 3:
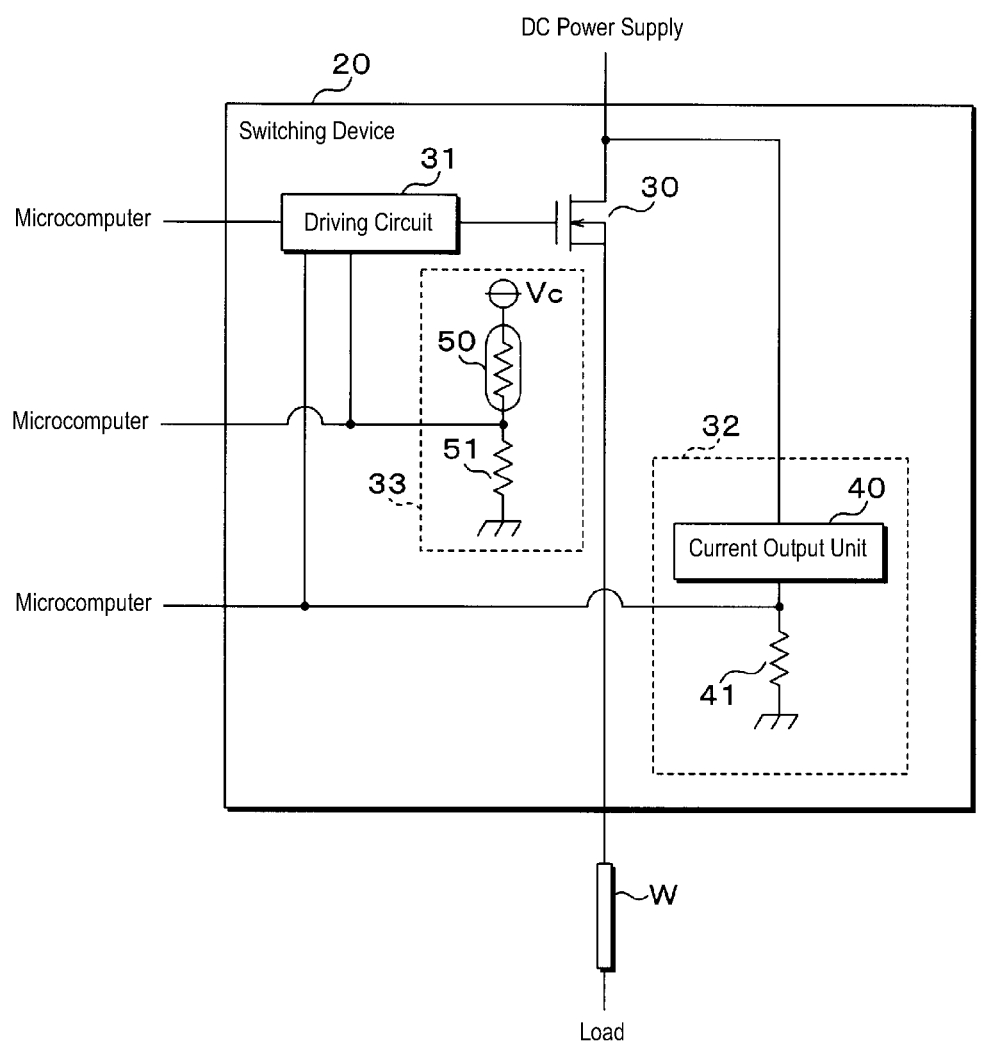
FIG. 3 is a circuit diagram illustrating a switching device.

The switching device 20 includes a switch 30 (see FIG. 3). The switch 30 is disposed on a current path of a current flowing from the positive electrode of the DC power supply 12 to the load 13. When the switch 30 is switched on, a current flows from the positive electrode of the DC power supply 12 to the switch 30, the wire W, and the load 13 in this order. With this, power is supplied to the load 13. When the switch 30 is switched off, the current flow is cut off, and the power supply to the load 13 is stopped.

The switching device 20 outputs analog current value information indicating a wire current value of a current flowing through the wire W, to the microcomputer 21. The current value information is represented by a voltage proportional to the wire current. The switching device 20 also outputs switch temperature information indicating the temperature of the switch 30 to the microcomputer 21. Below, the temperature of the switch 30 is denoted as a switch temperature. The switch temperature information is represented by a voltage that changes according to the switch temperature.

The microcomputer 21 outputs a PWM (Pulse Width Modulation) signal or an off signal for causing the switch 30 to be off to the switching device 20. The PWM signal includes high-level voltage periods and low-level voltage periods. The off signal is at a low-level voltage. In the PWM signal, switching from a low-level voltage to a high-level voltage is periodically performed. The duty ratio of a PWM signal is a ratio of a period, in one cycle, in which the voltage of the PWM signal is at the high-level voltage. The unit of the duty ratio is percent. The duty ratio exceeds 0% and is 100% or less. The duty ratio is adjusted by adjusting the timing at which the signal is switched from the high-level voltage to the low-level voltage.

Note that, in the PWM signal, the signal may also be periodically switched from the high-level voltage to the low-level voltage. In this case, the duty ratio is adjusted by adjusting the timing at which the signal is switched from the low-level voltage to the high-level voltage.

Below, it is assumed that the microcomputer 21 is outputting a PWM signal to the switching device 20 in a state in which the wire current is less than a fixed current threshold, and the switch temperature is less than a fixed switch temperature threshold. When the PWM signal voltage is switched from a low-level voltage to a high-level voltage in this case, the switching device 20 switches the switch 30 from off to on. When the PWM signal voltage is switched from a high-level voltage to a low-level voltage in a similar case, the switching device 20 switches the switch 30 from on to off. When the microcomputer 21 is outputting a PWM signal, power is supplied to the load 13.

As described above, the switching device 20 performs PWM control for alternately switching switch 30 on and off according to the received PWM signal. The duty ratio in the PWM control indicates a ratio of a period, in a given period, in which the switch 30 is on. The duty ratio in the PWM control matches the duty ratio of the PWM signal. As the duty ratio of the PWM signal increases, the period in which the switch 30 is on increases. Therefore, as the duty ratio of the PWM signal increases, the average wire current value in a given period increases. The given period is one cycle of the PWM signal, for example.

When the microcomputer 21 is outputting an off signal, the switching device 20 keeps the switch 30 off. Therefore, when the microcomputer 21 is outputting the off signal, the load 13 stops operating.

When the wire current is the current threshold or more in the case where the microcomputer 21 is outputting a PWM signal to the switching device 20, the switching device 20 forcibly switches off the switch 30 irrelevant to the PWM signal input to the switching device 20, and keeps the switch 30 off. Below, the forcible switching off of the switch 30 is denoted as "self-shutting off". As a result of forcibly switching the switch 30 off, the current flow through the wire W is forcibly cut off.

When the wire current has increased to the current threshold or more, the switching device 20 outputs the largest voltage that is allowed to be output to the microcomputer 21. Accordingly, the execution of the self-shutting off is notified to the microcomputer 21. Upon receiving notification of the execution of the self-shutting off, the microcomputer 21 outputs an off signal to the switching device 20. When the microcomputer 21 outputs an off signal to the switching device 20, the self-shutting off is canceled.

When the witch temperature is the switch temperature threshold or more in the case where the microcomputer 21 is outputting a PWM signal to the switching device 20, the switching device 20 performs self-shutting off of the switch 30, irrelevant to the PWM signal input to the switching device 20. When the switch temperature has increased to a temperature that is the witch temperature threshold or more, the switching device 20 outputs the largest voltage that is allowed to be output to the microcomputer 21. Accordingly, the microcomputer 21 is notified of the execution of the self-shutting off. Upon receiving a notification indicating the execution of the self-shutting off, the microcomputer 21 outputs an off signal to the switching device 20. When the microcomputer 21 outputs an off signal to the switching device 20, the self-shutting off is canceled.

The voltage detecting unit 22 detects the voltage between two ends of the DC power supply 12. Below, the voltage between two ends of the DC power supply 12 is denoted as a power supply voltage. The voltage detecting unit 22 outputs analog power supply voltage information indicating the detected power supply voltage to the microcomputer 21. The power supply voltage information is represented by a voltage obtained by voltage-dividing the power supply voltage, for example.

The environmental temperature detecting unit 23 detects the environmental temperature in an area surrounding the wire W. The environmental temperature is an ambient temperature of the wire W. The environmental temperature detecting unit 23 outputs analog environmental temperature information indicating the detected environmental temperature. The environmental temperature information is represented by a voltage that changes according to the environmental temperature, for example.

Every time the sensor 15a generates vehicle data, the sensor 15a outputs the generated vehicle data to the microcomputer 21.

The microcomputer 21 transmits the vehicle data received from the sensor to the integrated ECU 10. The microcomputer 21 receives instruction data for instructing that the load 13 be caused to start or stop operating from the integrated ECU 10. Upon receiving instruction data for instructing that the load 13 be caused to start operating, the microcomputer 21 outputs a PWM signal to the switching device 20. When the microcomputer 21 outputs a PWM signal to the switching device 20, the switching device 20 performs PWM control on the switch 30, and power is supplied to the load 13. As a result, the load 13 starts operating.

Upon receiving instruction data for instructing that the load 13 be caused to stop operating, the microcomputer 21 outputs an off signal to the switching device 20. Accordingly, power supply to the load 13 stops, and the load 13 stops operating. When outputting a PWM signal to the switching device 20, the microcomputer 21 adjusts the duty ratio of the PWM signal based on the power supply voltage indicated by the power supply voltage information received from the voltage detecting unit 22. Also, the microcomputer 21 repeatedly calculates the wire temperature of the wire W based on the wire current value of the wire W that is indicated by the current value information input from the switching device 20, the environmental temperature indicated by the environmental temperature information received from the environmental temperature detecting unit 23, and the duty ratio of the PWM signal output to the switching device 20.

When the calculated wire temperature of the wire W is a fixed wire temperature threshold or more, the microcomputer 21 outputs an off signal to the switching device 20. With this, the switching device 20 switches the switch 30 off. As a result, the power supply to the load 13 stops, and the load 13 stops operating.

Configuration of Switching Device 20

FIG. 3 is a circuit diagram of the switching device 20. The switching device 20 includes a driving circuit 31, a current detecting circuit 32, and a switch temperature detecting circuit 33, in addition to the switch 30. The switch 30 is an N-channel FET. The current detecting circuit 32 includes a current output unit 40 and a current detection resistor 41. The switch temperature detecting circuit 33 includes an NTC (Negative Temperature Coefficient) type thermistor 50 and a temperature detection resistor 51.

The drain of the switch 30 is connected to the positive electrode of the DC power supply 12. The source of the switch 30 is connected to one end of the wire W. As described above, the other end of the wire W is connected to one end of the load 13. The gate of the switch 30 is connected to the driving circuit 31. The driving circuit 31 is also connected to the microcomputer 21.

The drain of the switch 30 is also connected to the current output unit 40 of the current detecting circuit 32. The current output unit 40 is also connected to one end of the current detection resistor 41. The other end of the current detection resistor 41 is grounded. The connection node between the current output unit 40 and the current detection resistor 41 is connected to the microcomputer 21 and the driving circuit 31.

In the switch temperature detecting circuit 33, a fixed voltage is applied to one end of the thermistor 50. The fixed voltage is generated by a regulator (not shown) stepping down the voltage between two ends of the DC power supply 12, for example. The reference potential of the fixed voltage is the ground potential. The voltage value of the fixed voltage is denoted as Vc. The other end of the thermistor 50 is connected to one end of the temperature detection resistor 51. The other end of the temperature detection resistor 51 is grounded. The connection node between the thermistor 50 and the temperature detection resistor 51 is connected to the microcomputer 21 and the driving circuit 31.

In the switch 30, when the gate voltage relative to the source potential is a given voltage or more, the switch 30 is on. When the switch 30 is on, the resistance between the drain and source, in the switch 30, is sufficiently small. Therefore, a current can flow through the drain and source of the switch 30. When the switch 30 is on, a current flows from the positive electrode of the DC power supply 12 to the switch 30, the wire W, and the load 13, in this order. Accordingly, the switch 30 is disposed on a current path of current flowing through the wire W.

In the switch 30, when the gate voltage relative to the source potential is less than the given voltage, the switch 30 is off. When the switch 30 is off, the resistance between the drain and source, in the switch 30, is sufficiently large. Therefore, a current cannot flow through the drain and source of the switch 30. When the switch 30 is off, a current cannot flow through the switch 30 and the wire W.

The microcomputer 21 outputs a PWM signal to the driving circuit 31. Assume that the wire current value is less than the current threshold, and the switch temperature is less than the switch temperature threshold. When the PWM signal voltage is switched from a low-level voltage to a high-level voltage in this case, the driving circuit 31 increases the gate voltage relative to the ground potential, in the switch 30. Accordingly, in the switch 30, the gate voltage relative to the source potential increases to a voltage that is the given voltage value or more, and the switch 30 is switched on.

In a similar case, when the PWM signal voltage is switched from a high-level voltage to a low-level voltage, the driving circuit 31 reduces the gate voltage relative to the ground potential, in the switch 30. Accordingly, in the switch 30, the gate voltage relative to the ground potential decreases to a voltage that is less than the given voltage value, and the switch 30 is switched off.

As described above, the driving circuit 31 switches the switch 30 on or off, by adjusting the gate voltage relative to the source potential. The driving circuit 31 functions as a switching circuit. Assume that the wire current is less than the current threshold, and the switch temperature is less than the switch temperature threshold. When the microcomputer 21 is outputting a PWM signal to the driving circuit 31 in this case, the driving circuit 31 performs PWM control on the switch 30 according to the PWM signal voltage. As described above, the duty ratio in the PWM control matches the duty ratio of the PWM signal. When the driving circuit 31 performs PWM control on the switch 30, power is supplied to the load 13.

The microcomputer 21 outputs an off signal to the driving circuit 31. When the microcomputer 21 outputs an off signal to the driving circuit 31, the driving circuit 31 switches the switch 30 off. While the microcomputer 21 is outputting an off signal, the driving circuit 31 keeps the switch 30 off.

In the current detecting circuit 32, the current output unit 40 draws in current from the drain of the switch 30, and outputs the drawn-in current to the current detection resistor 41. The current value of current drawn-in by the current output unit 40 is proportional to the wire current and is represented by a formula (wire current value)/(predetermined number). The predetermined number is 1000, for example. The wire current value is a current value of a current flowing through the switch 30 and the wire W.

The current detecting circuit 32 outputs the voltage between two ends of the current detection resistor 41 to the microcomputer 21 and the driving circuit 31, as the current value information. The current value information is represented by a voltage obtained using the formula (wire current value)·(resistance value of the current detection resistor 41)/(predetermined number). The symbol "·" indicates multiplication. The resistance value of the current detection resistor 41 and the predetermined number are fixed values, and therefore the wire current value can be calculated based on the current value information. The current value information increases as the wire current increases.

While the microcomputer 21 is outputting a PWM signal to the driving circuit 31, a current flows through the switch 30 and a wire W. When the wire current value indicated by the current value information has increased to a current value that is the wire current threshold or more, the driving circuit 31 performs self-shutting off of the switch 30 irrelevant to the input PWM signal.

When the wire current value indicated by the current value information has increased to a current value that is the wire current threshold or more, the driving circuit 31 applies a voltage between two ends of the current detection resistor 41. This voltage is a largest voltage that is allowed to be output to the microcomputer 21. The largest voltage is input to the microcomputer 21. With this, the microcomputer 21 is notified of execution of self-shutting off of the driving circuit 31. As described above, upon receiving a notification of execution of self-shutting off, the microcomputer 21 outputs an off signal to the driving circuit 31. When the microcomputer 21 outputs an off signal, the self-shutting off of the driving circuit 31 is canceled.

In the switch temperature detecting circuit 33, the fixed voltage whose voltage value is Vc is voltage-divided by the thermistor 50 and the temperature detection resistor 51. The switch temperature detecting circuit 33 outputs the divided voltage obtained by voltage-dividing the fixed voltage to the microcomputer 21 and the driving circuit 31, as switch temperature information. The resistance value of the temperature detection resistor 51 is denoted as rd. The resistance value of the thermistor 50 is denoted as rt. The switch temperature information, that is, the divided voltage value is represented by a formula Vc·rd/(rd+rt). The voltage value Vc and the resistance value rd are fixed values, and therefore the switch temperature information indicates the resistance value rt of the thermistor 50.

The thermistor 50 is an NTC type thermistor, and therefore the resistance value rt decreases as the temperature of the thermistor 50 increases. The thermistor 50 is disposed in the vicinity of the switch 30. When the switch temperature of the switch 30 increases, the temperature of the thermistor 50 increases. When the switch temperature decreases, the temperature of the thermistor 50 decreases. Accordingly, the resistance value rt of the thermistor 50 decreases as the switch temperature increases. Therefore, the resistance value rt of the thermistor 50 indicates the switch temperature. The switch temperature information, that is, the divided-voltage increases as the switch temperature increases.

When the switch temperature indicated by the switch temperature information has increased to a temperature that is the switch temperature threshold or more, the driving circuit 31 applies a voltage between two ends of the temperature detection resistor 51. This voltage is the largest voltage that is allowed to be output to the microcomputer 21. The largest voltage is input to the microcomputer 21. With this, the microcomputer 21 is notified of execution of self-shutting off of the driving circuit 31. As described above, upon receiving a notification of execution of self-shutting off, the microcomputer 21 outputs an off signal to the driving circuit 31. When the microcomputer 21 outputs an off signal, the self-shutting off of the driving circuit 31 is canceled.

As described above, when the microcomputer 21 outputs a PWM signal to the driving circuit 31, the driving circuit 31 performs PWM control on the switch 30. As a result, a current flows through the switch 30 and the wire W, and the switch temperature increases. When the wire current has increased to the wire current threshold or more, or when the switch temperature has increased to a temperature that is the switch temperature threshold or more, the driving circuit 31 performs self-shutting off, and notifies the microcomputer 21 of the fact that self-shutting off has been executed. Upon receiving a notification of execution of self-shutting off, the microcomputer 21 outputs an off signal to the driving circuit 31. With this, the self-shutting off of the driving circuit 31 is canceled.

Note that, in the switch temperature detecting circuit 33, the type of the thermistor 50 is not limited to NTC, and may also be PTC (Positive Temperature Coefficient). In this case, the resistance value of the thermistor 50 increases, as the temperature of the thermistor 50, that is, the switch temperature increases. Therefore, the switch temperature information decreases as the switch temperature increases. Moreover, the positions of the thermistor 50 and the temperature detection resistor 51 may also be reversed. In this case, the thermistor 50 is grounded, and a fixed voltage is applied to the temperature detection resistor 51. In the case where a fixed voltage is applied to the temperature detection resistor 51, when the type of the thermistor 50 is NTC, the switch temperature information decreases as the switch temperature increases. When the type of the thermistor is PTC in a similar case, the switch temperature information increases as the switch temperature increases. In the case where a fixed voltage is applied to the temperature detection resistor 51, when the driving circuit 31 has performed self-shutting off, the driving circuit 31 applies a voltage to the thermistor 50.

Main Configuration of Microcomputer 21

Figure 4:
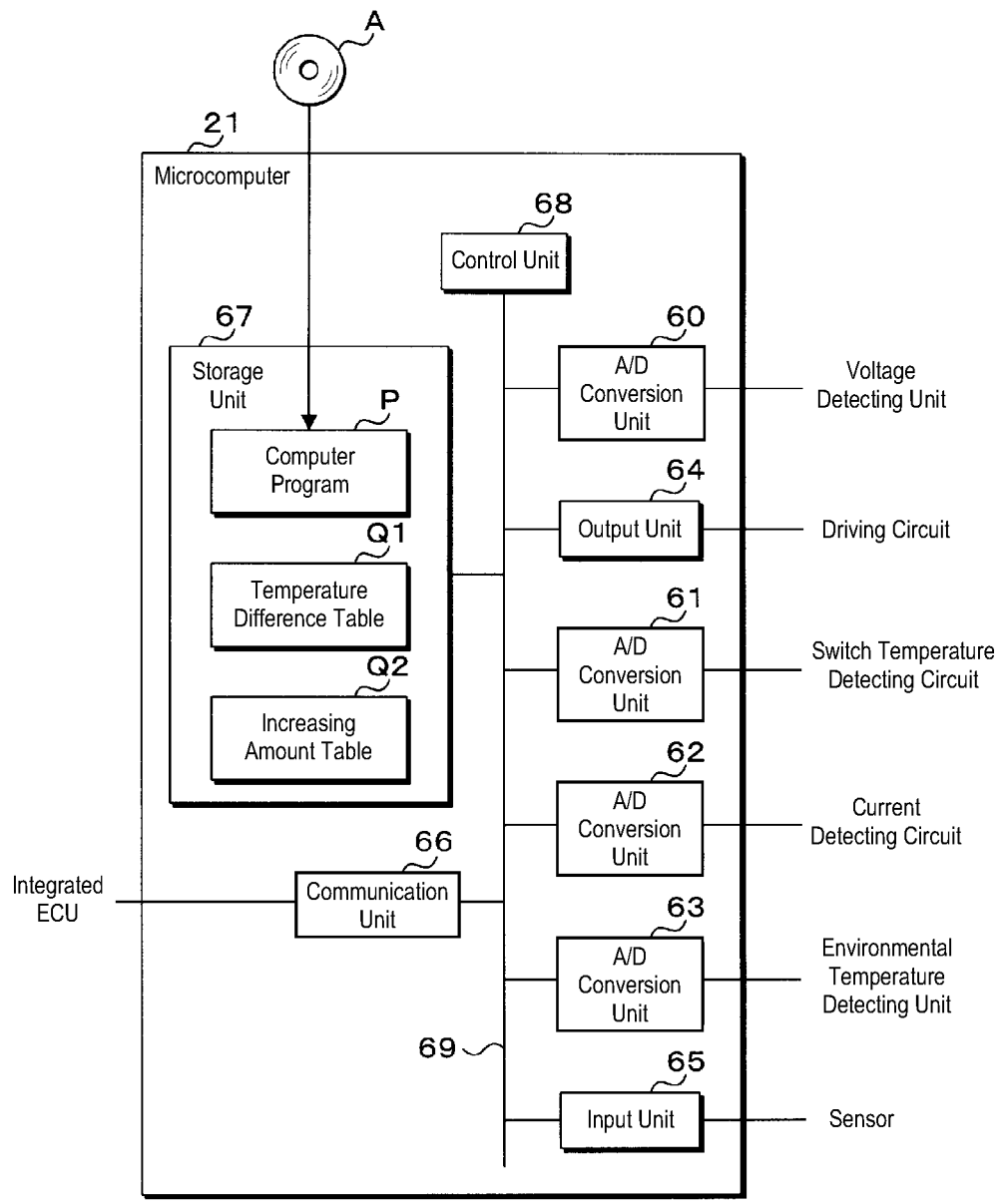
FIG. 4 is a block diagram illustrating the main configuration of a microcomputer.

FIG. 4 is a block diagram illustrating the main configuration of the microcomputer 21. The microcomputer 21 includes A/D conversion units 60, 61, 62, and 63, an output unit 64, an input unit 65, a communication unit 66, a storage unit 67, and a control unit 68. These units are connected to an internal bus 69. The A/D conversion units 60, 61, 62, and 63 are respectively also connected to the voltage detecting unit 22, the switch temperature detecting circuit 33, the current detecting circuit 32, and the environmental temperature detecting unit 23. The output unit 64 is also connected to the driving circuit 31. The input unit 65 is also connected to the sensor 15a. The communication unit 66 is also connected to the integrated ECU 10.

The voltage detecting unit 22 outputs analog power supply voltage information to the A/D conversion unit 60. The A/D conversion unit 60 converts the received analog power supply voltage information to digital power supply voltage information. The control unit 68 acquires the digital power supply voltage information from the A/D conversion unit 60.

The output unit 64 is an interface. The output unit 64 outputs a PWM signal and an off signal to the driving circuit 31 in accordance with an instruction from the control unit 68. The duty ratio of the PWM signal output by the output unit 64 is adjusted by the control unit 68.

The switch temperature detecting circuit 33 outputs analog switch temperature information to the A/D conversion unit 61. The A/D conversion unit 61 converts the received analog switch temperature information to digital switch temperature information. The control unit 68 acquires the digital switch temperature information from the A/D conversion unit 61.

The current detecting circuit 32 outputs analog current value information to the A/D conversion unit 62. The A/D conversion unit 62 converts the received analog current value information to digital current value information. The control unit 68 acquires the digital current value information from the A/D conversion unit 62.

The environmental temperature detecting unit 23 outputs analog environmental temperature information to the A/D conversion unit 63. The A/D conversion unit 63 converts the received analog environmental temperature information to digital environmental temperature information. The control unit 68 receives the digital environmental temperature information from the A/D conversion unit 63.

The input unit 65 is an interface. Every time the sensor 15a generates vehicle data, the sensor 15a outputs the generated vehicle data to the input unit 65. The control unit 68 acquires the vehicle data received from the sensor 15a from the input unit 65.

The communication unit 66 transmits vehicle data to the integrated ECU in accordance with an instruction from the control unit 68. The communication unit 66 receives instruction data for instructing that the load 13 be caused to start or stop operating from the integrated ECU 10. The communication unit 66 functions as a receiving unit.

The storage unit 67 is a nonvolatile memory. A computer program P is stored in the storage unit 67. The control unit 68 includes a processing element that executes processing, such as a CPU (Central Processing Unit). The control unit 68 functions as a processing unit. The processing element (computer) of the control unit 68 executes, in parallel, vehicle data transmission processing, temperature calculation processing, power supply control processing, and the like, by executing the computer program P. The vehicle data transmission processing is processing for transmitting vehicle data to the integrated ECU 10. The temperature calculation processing is processing for calculating the wire temperature of the wire W. The power supply control processing is processing for controlling power supply to the load 13.

Note that the computer program P may also be stored in a non-transitory storage medium A such that the processing element of the control unit 68 can read the computer program P. In this case, the computer program P read out from the storage medium A by a reading device (not shown) is written into the storage unit 67. The storage medium A is an optical disk, a flexible disk, a magnetic disk, a magneto-optical disk, a semiconductor memory, or the like. The optical disk is a CD (Compact Disc)-ROM (Read Only Memory), a DVD (Digital Versatile Disc)-ROM, a BD (Blu-ray (registered trademark) Disc), or the like. The magnetic disk is a hard disk, for example. Also, the computer program P may also be downloaded from an external device (not shown) that is connected to a communication network (not shown), and the downloaded computer program P may be written into the storage unit 67.

The number of processing elements included in the control unit 68 is not limited to one, and may also be two or more. When the number of processing elements included in the control unit 68 is two or more, the plurality of processing elements execute the vehicle data transmission processing, the temperature calculation processing, the power supply control processing, and the like, in a cooperative manner.

The control unit 68 periodically executes the temperature calculation processing. In the temperature calculation processing, the control unit 68 calculates the temperature difference between the wire temperature and the environmental temperature, and adds the environmental temperature to the calculated temperature difference. With this, the wire temperature is calculated.

In the calculation of the wire temperature, the control unit 68 calculates a temperature difference $\Delta Tw$ by substituting a prior temperature difference $\Delta Tp$ that was calculated previously, a wire current Iw of the wire W, an environmental temperature Ta, and a duty ratio D of the PWM signal, that is, a duty ratio D in the PWM control, in the following formulas [1], [2].

$$\Delta Tw = \Delta Tp \cdot \exp(-\Delta t/\tau r) + Rth \cdot Rw \cdot D \cdot Iw^2 \cdot (1-\exp(-\Delta t/\tau r))/100 \quad [1]$$

$$Rw = Ro \cdot (1 + K(Ta + \Delta Tp - To)) \quad [2]$$

The variables and constants used in the formulas [1] and [2] will be described. In the description of the variables and constants, the units of the variables and constants are also shown. $\Delta Tw$, $\Delta Tp$, Ta, Iw, Rw, Rth, and D are respectively a calculated temperature difference (° C.), a prior temperature difference (° C.), an environmental temperature (° C.), a wire current (A) of the wire W, a wire resistance (Ω) of the wire W, a wire thermal resistance (° C./W) of the wire W, and a duty ratio of the PWM signal, as described above. $\Delta t$ is a cycle (s) with which the temperature difference $\Delta Tw$ is calculated, that is, a cycle with which the temperature calculation processing is executed. $\tau r$ is a wire heat release time constant (s) of the wire W.

To is a predetermined temperature (° C.). Ro is a wire resistance (Ω) at the temperature To. K. is a wire resistance temperature coefficient (/° C.) of the wire W. The temperature difference $\Delta Tw$, prior temperature difference $\Delta Tp$, wire current Iw, and environmental temperature Ta are variables. The cycle $\Delta t$, wire heat release time constant $\tau r$, wire thermal resistance Rth, wire resistance Ro, wire resistance temperature coefficient K, and temperature To are preset constants. The value of the first term in the formula [1] decreases as the cycle $\Delta t$ increases, and therefore the first term of the computation formula [1] represents heat released from the wire W Also, the value of the second term of the formula [1] increases as the cycle $\Delta t$ increases, and therefore, the second term of the formula [1] represents the heat generated by the wire W.

The wire temperature of the wire W and the prior temperature difference are stored in the storage unit 67. The wire temperature and the prior temperature difference that are stored in the storage unit 67 are changed by the control unit 68.

Also, in the power supply control processing, the control unit 68 increases the duty ratio of the PWM signal in a stepwise manner. A temperature difference table Q1 is stored in the storage unit 67. In the temperature difference table Q1, a plurality of upper limit values for the temperature difference between the wire temperature and the environmental temperature are shown in association with a plurality of duty ratios in PWM control. Every time the control unit 68 increases the duty ratio in PWM signal, the control unit 68 determines whether or not an anomaly has occurred in power supply to the load 13 through the wire W based on whether or not the temperature difference is the upper limit value, or more, of the temperature difference associated with the duty ratio of the PWM signal output to the driving circuit 31.

FIG. 5 is a diagram illustrating content of the temperature difference table Q1. As shown in FIG. 5, temperature differences between the wire temperature and the environmental temperature are shown in the temperature difference table Q1 in association with a plurality of duty ratios. In the example in FIG. 5, a plurality of duty ratios are shown in increments of 10%. The upper limit values of the temperature difference associated with the respective duty ratios are shown. The upper limit value is a temperature difference calculated when the duty ratio of the PWM signal is adjusted to a duty ratio shown in the temperature difference table Q1, in the case where the power supply voltage of the DC power supply 12 is at a maximum value in a normal state, for example. In the temperature difference table Q1, as the duty ratio increases, the upper limit value increases.

As described above, in the power supply control processing, the control unit 68 increases the duty ratio of the PWM signal in a stepwise manner. An increasing amount table Q2 is stored in the storage unit 67. In the increasing amount table Q2, a plurality of increasing amounts of the temperature difference between the wire temperature and the environmental temperature are shown in association with a plurality of amounts of increase in the duty ratio. Every time the control unit 68 increases the duty ratio of the PWM signal, the control unit 68 determines whether or not an anomaly has occurred in the power supply to the load 13 through the wire W based on whether or not the amount of increase in the temperature difference is the upper limit value of the increasing amount associated with the actual increase in the duty ratio or more.

FIG. 6 is a diagram illustrating content of the increasing amount table Q2. As shown in FIG. 6, in the increasing amount table Q2, upper limit values of the amount of increase in the temperature difference are shown in association with a plurality of amounts of increase in the duty ratio. In the example in FIG. 6, the duty ratio is increased in increments of 10%. The upper limit value is an amount of increase in the temperature difference calculated when the duty ratio of the PWM signal is increased as shown in the increasing amount table Q2 in the case where the power supply voltage of the DC power supply 12 is at the largest value in a normal state, for example.

Note that, when the environmental temperature is the same, the amount of increase in the temperature difference corresponds to the amount of increase in the wire temperature. The wire temperature is represented by the sum of the temperature difference and the environmental temperature. When the environmental temperature is the same, the amount of increase between two wire temperatures is represented by the amount of increase in the temperature difference.

Vehicle Data Transmission Processing

In the vehicle data transmission processing, the control unit 68 waits until vehicle data is input to the input unit 65 from the sensor 15a. When vehicle data is input to the input unit 65, the control unit 68 acquires the vehicle data input to the input unit 65. Next, the control unit 68 instructs the communicating unit 66 to transmit the acquired vehicle data to the integrated ECU 10, and ends the vehicle data transmission processing. After ending the vehicle data transmission processing, the control unit 68 again executes the vehicle data transmission processing.

Temperature Calculation Processing

Figure 7:
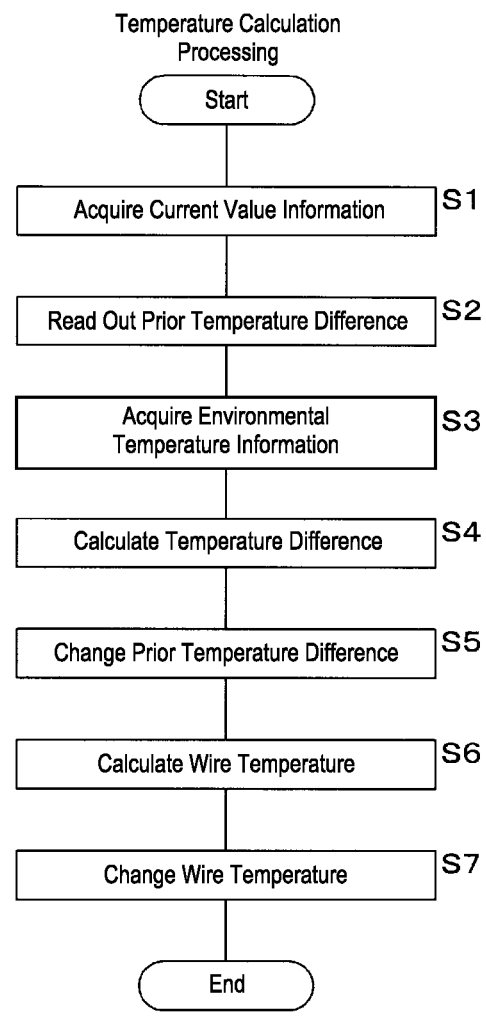
FIG. 7 is a flowchart illustrating a procedure of temperature calculation processing.

FIG. 7 is a flowchart illustrating a procedure of temperature calculation processing. As described above, the control unit 68 periodically executes the temperature calculation processing. In the temperature calculation processing, the control unit 68 acquires current value information indicating the wire current value of the wire W from the A/D conversion unit 62 (step S1). Once the output unit 64 outputs a duty ratio of the PWM signal, the control unit 68 acquires the current value information in a period in which the PWM signal is at a high-level voltage. Next, the control unit 68 reads out a prior temperature difference from the storage unit 67 (step S2). This prior temperature difference is a temperature difference calculated in the previous temperature calculation processing. In the temperature calculation processing that is first executed after the microcomputer 21 is started, the prior temperature difference is zero degrees. After executing step S2, the control unit 68 acquires environmental temperature information from the A/D conversion unit 63 (step S3).

The control unit 68 calculates the temperature difference between the wire temperature and the environmental temperature by substituting a plurality of numerical values in the formulas [1] and [2] (step S4). The plurality of numerical values are a wire current indicated by the current value information acquired in step S1, the prior temperature difference read out in step S2, an environmental temperature indicated by the environmental temperature information acquired in step S3, and a duty ratio of the PWM signal output by the output unit 64. When the output unit 64 outputs an off signal, the duty ratio is zero.

Next, the control unit 68 changes the prior temperature difference stored in the storage unit 67 to the temperature difference calculated in step S4 (step S5). The changed prior temperature difference is used next time temperature calculation processing is performed. The prior temperature difference is the latest temperature difference calculated in the temperature calculation processing. After executing step S5, the control unit 68 calculates the wire temperature by adding the temperature difference calculated in step S4 to the environmental temperature indicated by the environmental temperature information acquired in step S3 (step S6).

Next, the control unit 68 changes the wire temperature stored in the storage unit 67 to the wire temperature calculated in step S6 (step S7). Therefore, the wire temperature stored in the storage unit 67 is the latest wire temperature calculated in the temperature calculation processing. After executing step S7, the control unit 68 ends the temperature calculation processing.

As described above, the prior temperature difference, which is the latest temperature difference, and the latest wire temperature are stored in the storage unit 67.

Power Supply Control Processing

Figure 8:
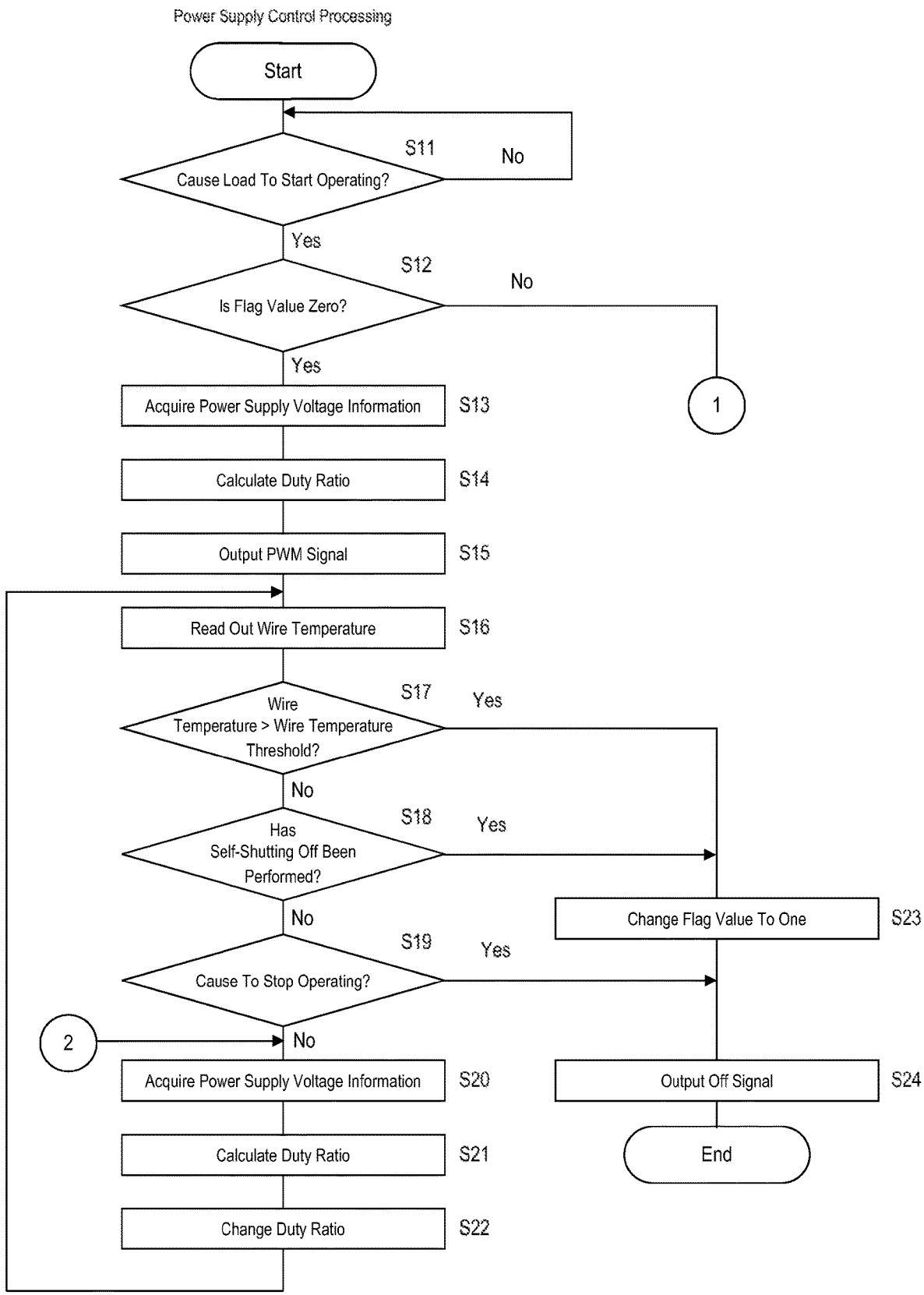
FIG. 8 is a flowchart illustrating a procedure of power supply control processing.
Figure 9:
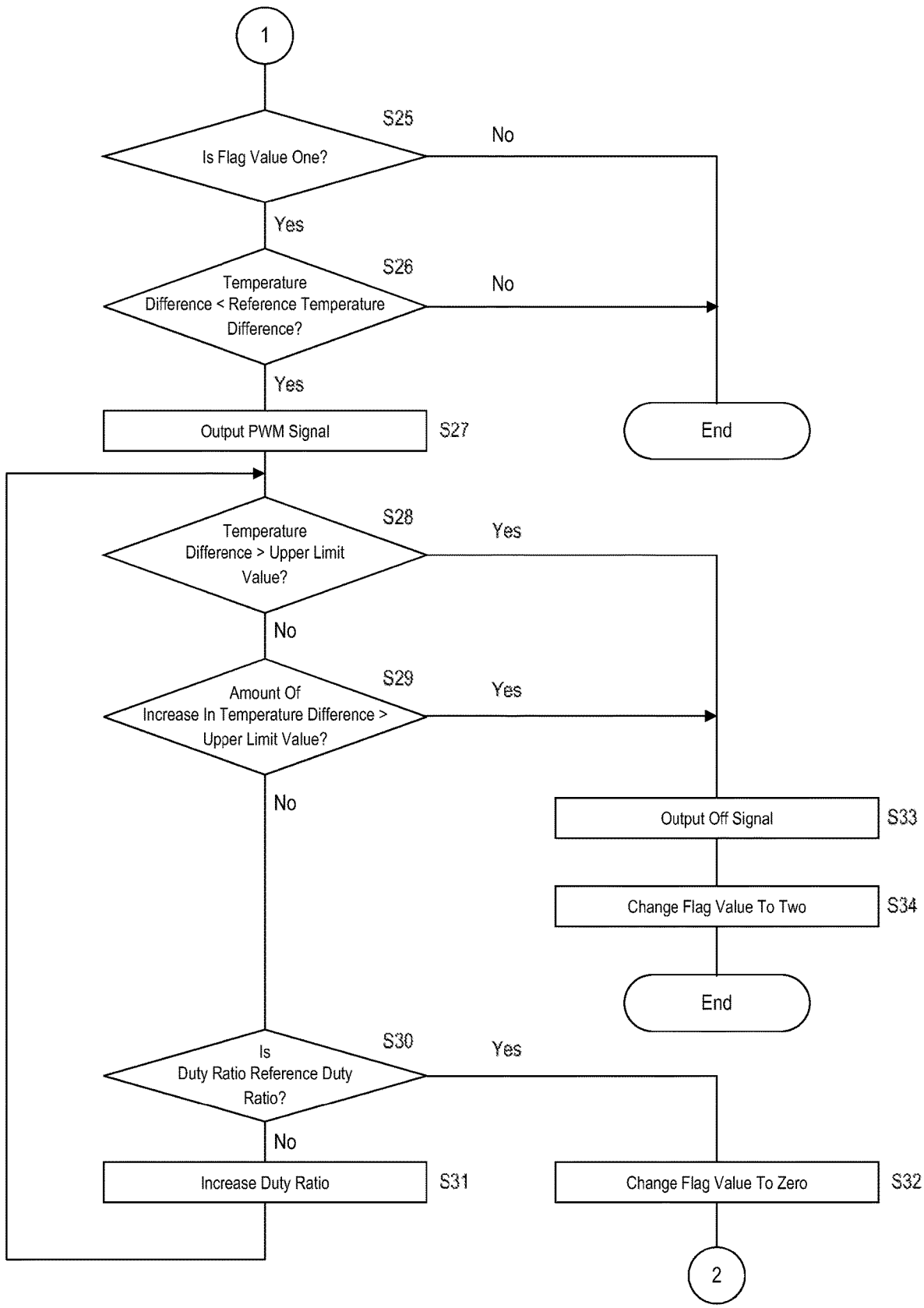
FIG. 9 is a flowchart illustrating a procedure of power supply control processing.

FIGS. 8 and 9 are flowcharts illustrating procedures of the power supply control processing. In the power supply control processing, the control unit 68 adjusts the duty ratio of the PWM signal to a duty ratio with which the related value related to the load 13 matches a fixed target value. The related value is a wire current value, power supplied to the power, or the voltage value of a voltage applied to the load 13. As described above, the wire current value is a current value of current flowing to the load 13 through the wire W.

Also, a flag value indicating the state of the individual ECU 11a is stored in the storage unit 67. The flag value is zero, one, or two, and is changed by the control unit 68. The flag value of zero indicates that power is properly supplied to the load 13. The flag value of one indicates that the current through the wire W has been forcibly cut off. The flag value of two indicates that an anomaly has occurred in power supply to the load 13.

The control unit 68 executes the power supply control processing in a state in which the output unit 64 outputs an off signal. In the power supply control processing, the control unit 68 first determines whether or not the load 13 is caused to start operating (step S11). In step S11, if the communication unit 66 has received instruction data for instructing that the load 13 be caused to start operating, the control unit 68 determines that the load 13 is to be caused to start operating. If the communication unit 66 has not received instruction data for instructing that the load 13 be caused to start operating, the control unit 68 determines that the load 13 is not to be caused to start operating. Upon determining that the load 13 is not to be caused to start operating (S11: NO), the control unit 68 again executes step S11, and waits until the communication unit 66 receives instruction data for instructing that the load 13 be caused to start operating.

Upon determining that the load 13 is to be caused to start operating (S11: YES), the control unit 68 determines whether or not the flag value is zero (step S12). If it is determined that the flag value is zero (S12: YES), the control unit 68 acquires power supply voltage information from the A/D conversion unit 60 (step S13). Next, the control unit 68 calculates the duty ratio of the PWM signal with which the average value of the related value in a given period matches a fixed target value based on the power supply voltage indicated by the power supply voltage information acquired in step S13 (step S14). The target value is set in advance. As described above, the given period is one cycle of the PWM signal, for example. For example, when the load 13 is a head light including LEDs (Light Emitting Diodes), the luminance of the load 13 increases as the average wire current in a given period increases. When the load 13 is a head light including LEDs, the related value is a wire current value. The target value is represented by a current value. The wire current flowing when the switch 30 is on is denoted as a switch current. The switch current is calculated based on the power supply voltage indicated by the power supply voltage information acquired in step S13. The duty ratio calculated by the control unit 68 in step S14 is represented by a formula 100·(target value)/(switch current value).

For example, when the load 13 is a head light including an incandescent lamp, the luminance of the load 13 increases as the average value of power supplied to the load 13 in a given period increases. When the load 13 is a head light including an incandescent lamp, the related value is the power supplied to the load 13. The target value is also represented by power. The power supplied to the load 13 when the switch 30 is on is denoted as load power. The load power is calculated based on the power supply voltage indicated by the power supply voltage information acquired in step S13. The duty ratio calculated by the control unit 68 in step S14 is represented by a formula 100·(target value)/(load power).

For example, when the load 13 is a DC motor, the rotational speed of the load 13 increases as the average value of a voltage applied to the load 13 in a given period increases. When the load 13 is a DC motor, the related value is a voltage value of a voltage applied to the load 13. The target value is also represented by a voltage value. The voltage applied to the load 13 when the switch 30 is on is denoted as a load voltage. The load voltage is calculated based on the power supply voltage indicated by the power supply voltage information acquired in step S13. The duty ratio calculated by the control unit 68 in step S14 is represented by a formula 100·(target value)/(load voltage value).

Next, the control unit 68 instructs the output unit 64 to output a PWM signal with the duty ratio calculated in step S14 (step S15). With this, the driving circuit 31 performs PWM control on the switch 30 according to the PWM signal voltage. The duty ratio in the PWM control performed by the driving circuit 31 is adjusted to the duty ratio calculated in step S14. As a result of the driving circuit 31 performing PWM control on the switch 30, a current flows through the wire W, and the average value of the related value is adjusted to the target value. As a result of current flowing through the wire W, power is supplied to the load through the wire W.

Next, the control unit 68 reads out the latest wire temperature calculated in the temperature calculation processing from the storage unit 67 (step S16), and determines whether or not the read-out wire temperature is a wire temperature threshold or more (step S17). Upon determining that the wire temperature is less than the wire temperature threshold (S17: NO), the control unit 68 determines whether or not self-shutting off of the switch 30 has been performed by the driving circuit 31 (step S18). In step S18, if the largest voltage that is allowed to be output to the microcomputer 21 is input to at least one of the A/D conversion units 61 and 62, the control unit 68 determines that the self-shutting off has been performed. If the maximum voltage is not input to the A/D conversion units 61 and 62, the control unit 68 determines that the self-shutting off has not been performed.

If it is determined that the self-shutting off has not been performed (S18: NO), the control unit 68 determines whether or not the load 13 is to be caused to stop operating (step S19). In step S19, if the communication unit 66 has received instruction data for instructing that the load 13 be caused to stop operating, the control unit 68 determines that the load 13 is to be caused to stop operating. If the communication unit 66 has not received instruction data for instructing that the load 13 be caused to stop operating, the control unit 68 determines that the load 13 is not to be caused to stop operating.

Upon determining that the load 13 is not to be caused to stop operating (S19: NO), the control unit 68 acquires power supply voltage information from the A/D conversion unit 60 (step S20). Next, similarly to step S14, the control unit 68 calculates the duty ratio of the PWM signal with which the average value of the related value matches a target value based on the power supply voltage indicated by the power supply voltage information acquired in step S20 (step S21). Next, the control unit 68 changes the duty ratio of the PWM signal output by the output unit 64 to the duty ratio calculated in step S21 (step S22). After executing step S22, the control unit 68 again executes step S16.

Assume that the wire temperature is less than the wire temperature threshold, self-shutting off has not been performed, and the communication unit 66 has not received instruction data instructing that the load 13 be caused to stop operating. In this case, the duty ratio is changed according to the power supply voltage of the DC power supply 12. Specifically, when the power supply voltage decreases, the control unit 68 increases the duty ratio. When the power supply voltage increases, the control unit 68 reduces the duty ratio. Accordingly, even if the power supply voltage changes, the related value of the load 13 is kept at the target value. In the case where the positive electrode of the DC power supply 12 is connected to a starter of a vehicle C, when the starter has started operating, the power supply voltage decreases. When the starter has stopped operating in a similar case, the power supply voltage increases.

Upon determining that the wire temperature is the wire temperature threshold or more (S17: YES), or determining that self-shutting off has been performed (S18: YES), the control unit 68 changes the flag value to one (step S23). Upon determining that the load 13 is to be caused to stop operating (S19: YES), or after executing step S23, the control unit 68 instructs the output unit 64 to output an off signal to the driving circuit 31 (step S24). With this, the driving circuit 31 keeps the switch 30 off. Accordingly, the current flowing through the wire W is cut off. As a result, power supply to the load 13 through the wire W stops. As described above, when the output unit 64 outputs an off signal in a state in which the driving circuit 31 has performed self-shutting off, the self-shutting off is canceled.

After executing step S24, the control unit 68 ends the power supply control processing. After ending the power supply control processing, the control unit 68 again executes the power supply control processing, and waits until the communication unit 66 receives instruction data for instructing that the load 13 be caused to start operating.

Upon determining that the flag value is not zero (S12: NO), the control unit 68 determines whether or not the flag value is one (step S25). Upon determining that the flag value is one (step S25: YES), the control unit 68 determines whether or not the latest temperature difference calculated in the temperature calculation processing is a reference temperature difference or less (step S26). The reference temperature difference is a fixed value, and is zero degrees or a positive temperature close to zero degrees. The reference temperature difference is set in advance.

Upon determining that the flag value is not one (S25: NO), or that the latest temperature difference exceeds the reference temperature difference (S26: NO), the control unit 68 ends the power supply control processing without causing the output unit 64 to output a PWM signal. After ending the power supply control processing, the control unit 68 again executes the power supply control processing.

As described above, when the flag value is two, power supply to the load 13 cannot be started. In the case of the flag value being one as well, when the latest temperature difference exceeds the reference temperature difference, the control unit 68 does not instruct the output unit 64 to output a PWM signal.

Upon determining that the latest temperature difference is the reference temperature difference or less (S26: YES), the control unit 68 instructs the output unit 64 to output a PWM signal to the driving circuit 31 (step S27). Accordingly, the driving circuit 31 performs PWM control. In step S27, the duty ratio of the PWM signal is adjusted to the smallest duty ratio among the plurality of duty ratios shown in the temperature difference table Q1. In the example in FIG. 5, the duty ratio of the PWM signal is adjusted to 10%. As a result of the control unit 68 executing step S27, a current flows to the load 13 through the wire W. The duty ratio of the PWM signal is small, and therefore the average wire current value is small.

After executing step S27, the control unit 68 determines whether or not the latest temperature difference calculated in the temperature calculation processing exceeds an upper limit value of the temperature difference associated with the duty ratio of the PWM signal output by the output unit 64, in the temperature difference table Q1 (step S28).

Note that the control unit 68 executes step S28 after a given period has elapsed since step S27 was executed. The given period is one cycle of the temperature calculation processing or more. Therefore, the temperature difference is calculated at least once since step S27 was executed.

Upon determining that the latest temperature difference is the upper limit value or less (S28: NO), the control unit 68 determines whether or not the amount of increase in the temperature difference due to the increase in the duty ratio of the PWM signal exceeds the upper limit value of the increasing amount associated with the increase in the duty ratio that has been actually performed, in the increasing amount table Q2 (step S29). In the example in FIG. 6, when the duty ratio has increased from 0% to 10% in response to the output unit 64 outputting the PWM signal, it is determined whether or not the actual increasing amount exceeds the upper limit value of the increasing amount associated with the increase from 0% to 10%.

Upon determining that the amount of increase in the temperature difference is the upper limit value or less (S29: NO), the control unit 68 determines whether or not the duty ratio of the PWM signal output by the output unit 64 is a reference duty ratio (step S30). The reference duty ratio is a fixed value and is set in advance. The reference duty ratio is the largest duty ratio shown in the temperature difference table Q1. In the example in FIG. 5, the reference duty ratio is 100%.

Note that the reference duty ratio is not limited to 100%. The reference duty ratio may also be a value less than 100%. For example, when the largest value of the duty ratio of the PWM signal is 80%, in the case where the duty ratio of the PWM signal has been adjusted such that the average related value of the load 13 matches the target value, the reference duty ratio may be set to 80%.

Upon determining that the duty ratio of the PWM signal is not the reference duty ratio (S30: NO), the control unit 68 increases the duty ratio of the PWM signal output by the output unit 64 (step S31). The duty ratio of the PWM signal output by the output unit 64 is denoted as an actual duty ratio. In step S31, the control unit 68 increases the duty ratio of the PWM signal to a duty ratio, in the temperature difference table Q1, that is larger than the actual duty ratio and is closest to the actual duty ratio. In the example in FIG. 5, when the actual duty ratio is 10%, in step S31, the control unit 68 increases the duty ratio of the PWM signal to 20%.

After executing step S31, the control unit 68 again executes step S28. The control unit 68 increases the duty ratio of the PWM signal, that is, the duty ratio in PWM control, in a stepwise manner, until the duty ratio of the PWM signal reaches the reference duty ratio. Accordingly, the average wire current in a given period increases in a stepwise manner. Every time the control unit 68 increases the duty ratio in PWM control, the control unit 68 executes steps S28 and S29. Upon determining that the duty ratio of the PWM signal is the reference duty ratio (S30: YES), the control unit 68 changes the flag value to zero (step S32). After executing step S32, the control unit 68 executes step S20.

As described above, if the state in which the temperature difference is the upper limit value or less, and the amount of increase in the temperature difference is the upper limit value or less continues during a period until the duty ratio of the PWM signal reaches the reference duty ratio, the control unit 68 determines that the individual ECU 11a is normal, and changes the flag value to zero. Thereafter, the control unit 68 executes step S20, and adjusts the duty ratio of the PWM signal according to the power supply voltage of the DC power supply 12.

Upon determining that the temperature difference exceeds the upper limit value (S28: YES), or determining that the amount of increase in the temperature difference exceeds the upper limit value (S29: YES), the control unit 68 instructs the output unit 64 to output an off signal to the driving circuit 31 (step S33). With this, the driving circuit 31 keeps the switch 30 off. After executing step S33, the control unit 68 changes the flag value to two (step S34), and ends the power supply control processing.

As described above, when the temperature difference exceeds the upper limit value, or the amount of increase in the temperature difference exceeds the upper limit value, the control unit 68 determines that an anomaly has occurred in power supply to the load 13, and changes the flag value to two. As described above, when the flag value is two, power is not be supplied to the load 13. Steps S28 and S29 each correspond to processing for determining whether or not an anomaly has occurred in power supply to the load 13. Therefore, determination as to whether or not an anomaly has occurred in power supply is made based on a comparison between the temperature difference and the upper limit value associated with the duty ratio in PWM control actually performed by the driving circuit 31. Moreover, determination as to whether or not an anomaly has occurred in power supply is made based on the amount of increase in the temperature difference caused by the increase in duty ratio in PWM control.

From the above, an anomaly in the power supply is a phenomenon in which the temperature difference increases to an upper limit value or more, or a phenomenon in which the amount of increase in the temperature difference (wire temperature) exceeds an upper limit value. An anomaly in the power supply occurs when two ends of the load 13 are shorted, for example.

State Transition in Power Supply

Figure 10:
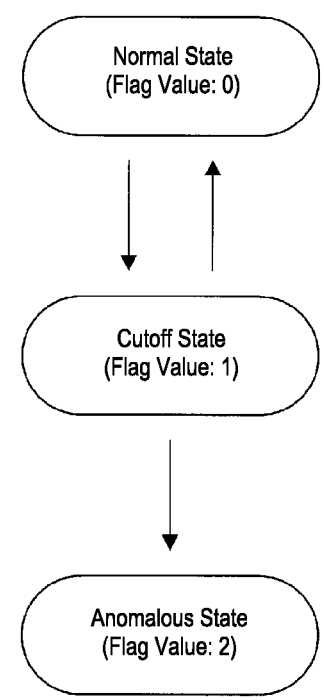
FIG. 10 is a state transition diagram of power supply.

FIG. 10 is a state transition diagram of power supply. When power is normally supplied to the load 13, the flag value is zero, and the power supply state is a normal state in which power is supplied normally. When the calculated wire temperature has increased to a temperature that is the wire temperature threshold or more, the control unit 68 instructs the driving circuit 31 to forcibly switch the switch 30 off. When the wire current has increased to a current that is the current threshold or more, or when the switch temperature has increased to a temperature that is the switch temperature threshold or more, the driving circuit 31 forcibly switches the switch 30 off.

By forcibly switching off the switch 30, the current flowing through the wire W is forcibly cut off. As a result, the flag value is changed to one, and the power supply state transitions to a cutoff state in which the current flowing through the wire W is forcibly cut off. Even in a case where the power supply state is the normal state, there is a possibility that the power supply state will transition to the cutoff state due to external noise, for example.

Figure 11:
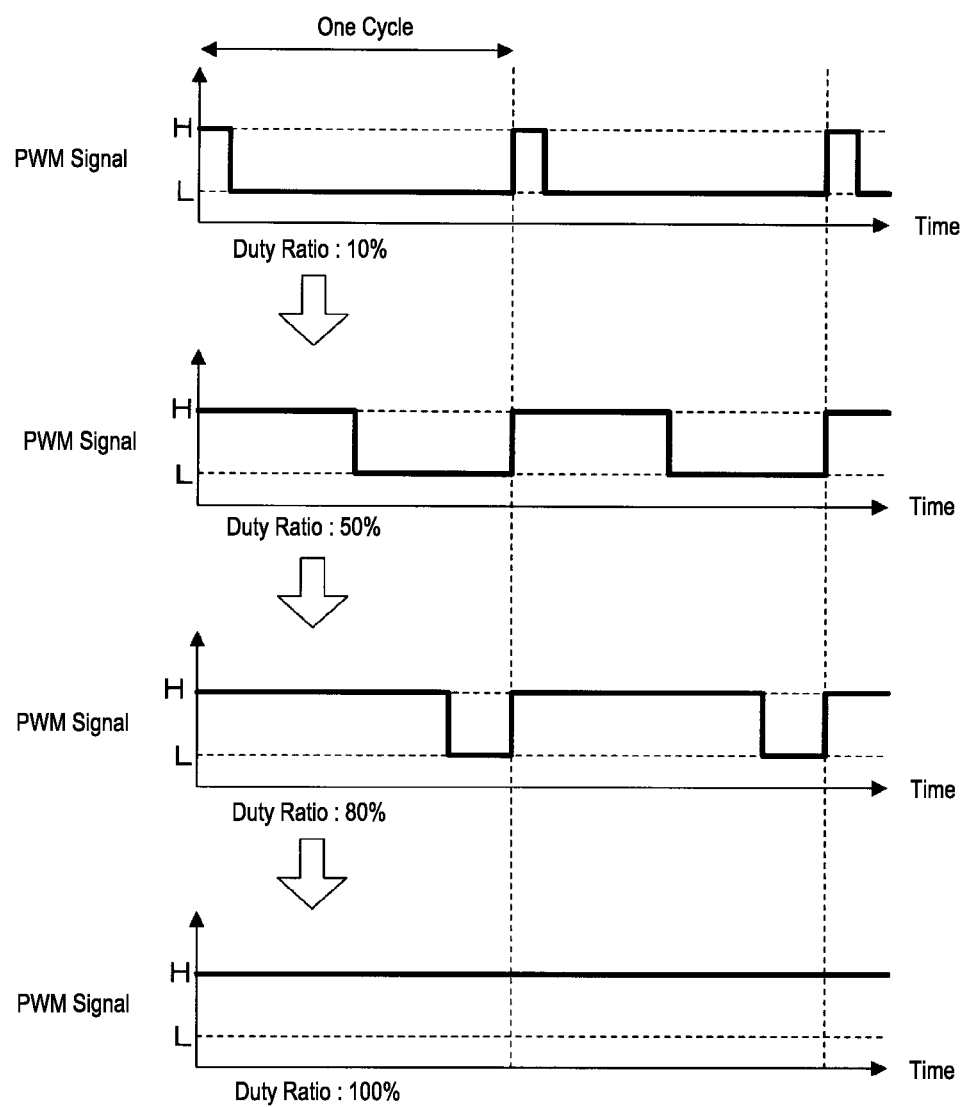
FIG. 11 is a diagram for describing a step-wise increase in the duty ratio of a PWM signal.

When an instruction that the load 13 be caused to start operating is made in a case where the power supply state is the cutoff state, the control unit 68 increases the duty ratio of the PWM signal in a stepwise manner. FIG. 11 is a diagram for describing a step-wise increase in the duty ratio of a PWM signal. Waveforms of the PWM signal that are different in the duty ratio are shown in FIG. 11. As shown in FIG. 11, the control unit 68 increases the duty ratio of the PWM signal in a stepwise manner. In the example in FIG. 11, the duty ratio of the PWM signal increases from 10% to 50%, 80%, and 100% in this order.

By increasing the duty ratio of the PWM signal in a stepwise manner, the wire current increases in a stepwise manner. Every time the control unit 68 increases the duty ratio, the control unit 68 determines whether or not an anomaly has occurred in power supply to the load 13 by performing a comparison between the temperature difference and the upper limit value and a comparison between the amount of increase in the temperature difference and the upper limit value. If the control unit 68 does not detect an anomaly in the power supply in a period until the duty ratio of the PWM signal has reached the reference duty ratio, the control unit 68 changes the flag value to zero, and causes the power supply state to transition to the normal state, as shown in FIG. 10.

If the control unit 68 has detected an anomaly in the power supply in a period until the duty ratio of the PWM signal has reached the reference duty ratio, the control unit 68 changes the flag value to two, and causes the power supply state to transition to an anomalous state in which an anomaly occurs in power supply to the load 13. After the power supply state transitions to the anomalous state, the power supply state will not transition to other states, and power will not be supplied to the load 13.

Effects of individual ECU 11*a*

In the individual ECU 11*a*, the control unit 68 increases the average wire current in a given period in a stepwise manner. Every time the control unit 68 increases the average wire current in a stepwise manner, the control unit 68 determines whether or not an anomaly has occurred in power supply based on the temperature difference between the wire temperature and the environmental temperature. Therefore, the control unit 68 can detect an anomaly in the power supply while the wire current is small. The control unit 68 increases the average wire current in a stepwise manner by increasing the duty ratio of the PWM signal (PWM control) in a stepwise manner. Therefore, a stepwise increase in the average wire current can be easily realized.

Second Embodiment

In the first embodiment, power supply to the load 13 through the wire W is realized by the driving circuit 31 performing PWM control on the switch 30. However, the method of realizing power supply to the load 13 is not limited to the method of the driving circuit 31 performing PWM control.

The differences of the second embodiment from the first embodiment will be described below. The configurations other than the configurations described below are in common with the first embodiment. Therefore, the constituent units that are in common with the first embodiment are given the same reference numerals as the first embodiment, and the description thereof will be omitted.

Configuration of Microcomputer 21

In the first embodiment, the output unit 64 shown in FIG. 4 outputs a PWM signal and an off signal to the driving circuit 31 in accordance with an instruction from the control unit 68. In the second embodiment, an output unit 64 also outputs an on signal indicating switching on of a switch 30 to the driving circuit 31, in accordance with an instruction from a control unit 68. The on signal is at a high-level voltage.

Configuration of Switching Device 20

When the output unit 64 of a microcomputer 21 outputs an on signal to a driving circuit 31, the driving circuit 31 switches the switch 30 on. While the microcomputer 21 is outputting an on signal, the driving circuit 31 keeps the switch 30 on. As described in the first embodiment, when the switch 30 is switched on, current flows from a positive electrode of a DC power supply 12 to the switch 30, a wire W, and a load 13 in this order. With this, power is supplied to the load 13, and the load 13 starts operating.

When a wire current value is a current threshold or more in a case where the output unit 64 outputs a PWM signal or an on signal to the driving circuit 31, the driving circuit 31 performs self-shutting off of the switch 30 irrelevant to the signal input to the driving circuit 31. When the switch temperature of the switch 30 is a switch temperature threshold or more in a similar case, the driving circuit 31 performs self-shutting off of the switch 30 irrelevant to the signal input to the driving circuit 31. When the driving circuit 31 has performed self-shutting off in relation to the wire current value or the switch temperature, the driving circuit 31 notifies the microcomputer 21 of the fact that self-shutting off has been performed, similarly to the first embodiment.

Temperature Calculation Processing

When the output unit 64 outputs an on signal, the control unit 68 calculates the wire temperature using the formulas [1] and [2], where the duty ratio D is set to 100%.

Power Supply Control Processing

Figure 12:
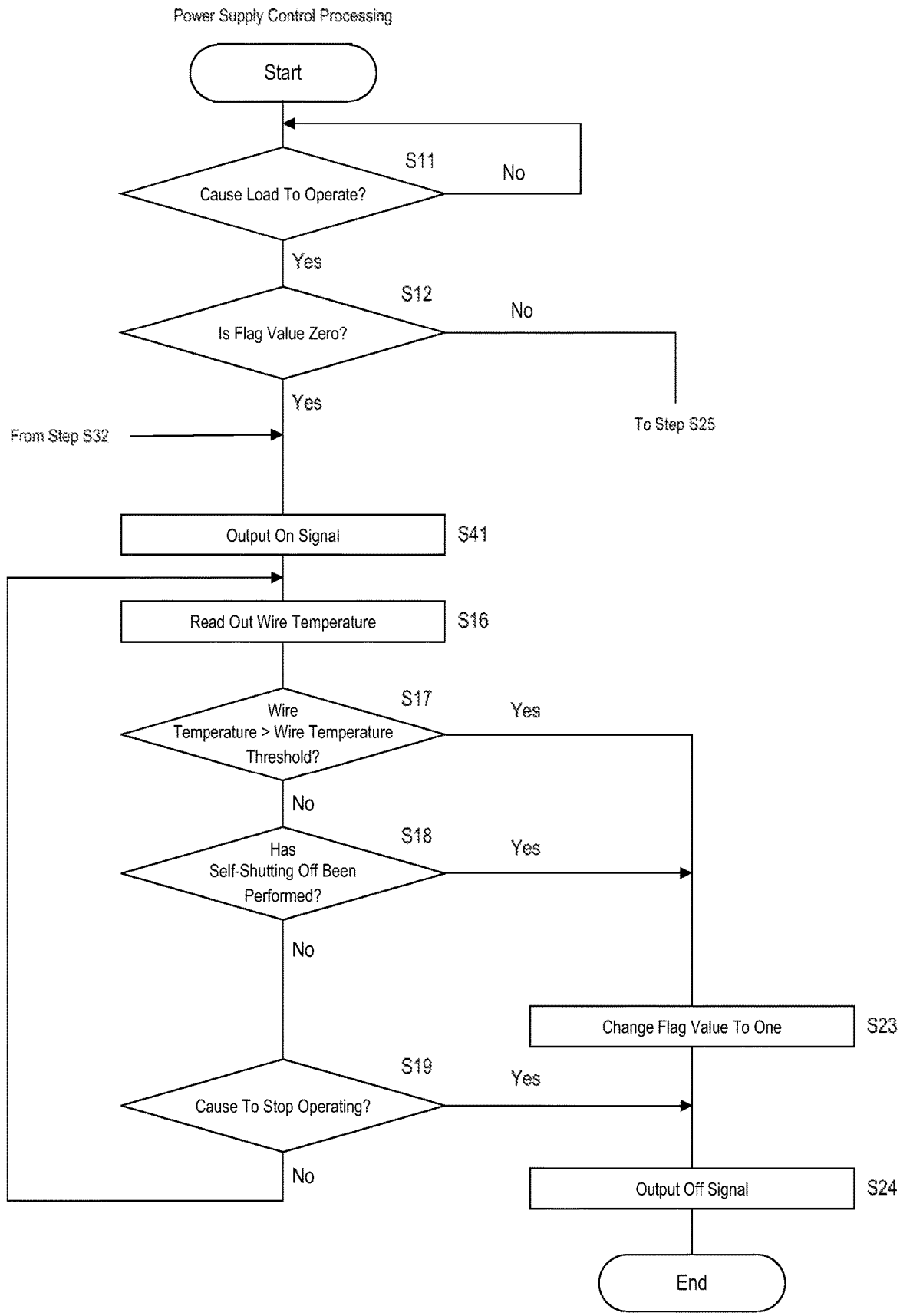
FIG. 12 is a flowchart illustrating a procedure of power supply control processing in a second embodiment.

FIG. 12 is a flowchart illustrating a procedure of power supply control processing in the second embodiment. A portion of the power supply control processing in the second embodiment is in common with a portion of the power supply control processing in the first embodiment. Steps S11, S12, S16 to S19, and S23 to S34, in the power supply control processing in the second embodiment, that are in common with those in the power supply control processing in the first embodiment will not be described in detail.

In the power supply control processing in the second embodiment, upon determining that the flag value is zero (S12: YES), the control unit 68 instructs the output unit 64 to output an on signal (step S41). With this, the driving circuit 31 switches the switch 30 on. While the output unit 64 is outputting an on signal, the driving circuit 31 keeps the switch 30 on. As described above, when the switch 30 is on, power is supplied to the load 13, and the load 13 operates. After executing step S41, the control unit 68 executes step S16.

As described above, when the flag value is zero, power is supplied to the load 13 by keeping the switch 30 on.

Upon determining that the load 13 is not to be caused to stop operating (S19: NO), the control unit 68 again executes step S16. Assume that the wire temperature is less than the wire temperature threshold, the self-shutting off has not been performed, and the communication unit 66 has not received instruction data instructing that the load 13 be caused to stop operating. In this case, the switch 30 is kept on.

After executing step S32, the control unit 68 executes step S41. Therefore, after the flag value is changed from one to zero, that is, the power supply state has transitioned from the cutoff state to the normal state, the switch 30 is kept on.

Effects of individual ECU 11a

The individual ECU 11a in the second embodiment similarly achieves the effects achieved by the individual ECU 11a in the first embodiment, other than the effects obtained by changing the duty ratio in the PWM control according to the power supply voltage.

Modifications

The timing at which anomaly determination is made as to whether or not an anomaly has occurred in the power supply to the load 13 while increasing the wire current value in a stepwise manner, in the first and second embodiments, is not limited to the timing at which, when the power supply state is the cutoff state, the load 13 is caused to start operating. The timing at which the anomaly determination is made may be a timing at which the load 13 is first caused to start operating after the ignition switch of a vehicle C has been switched from off to on, for example. Also, the switch temperature detecting circuit 33 is not limited to a circuit in which the thermistor 50 is used. The switch temperature detecting circuit 33 needs only be a circuit that can detect the switch temperature of the switch 30.

The current value information output by the current detecting circuit 32 is not limited to being represented by a signal voltage according to the wire current, and may also be digital information, for example. The switch temperature information output by the switch temperature detecting circuit 33 is not limited to being represented by a signal voltage that changes according to the switch temperature, and may also be digital information, for example. Also, the method of making a notification that the self-shutting off has been executed is not limited to the method of applying a voltage, and may also be a method of outputting information indicating that the self-shutting off has been executed to the microcomputer 21.

The method of adjusting the wire current is not limited to the method of adjusting the duty ratio in the PWM control. When a variable resistor is disposed on a current path, the wire current may also be adjusted by adjusting the resistance of the variable resistor. The device that calculates a wire temperature is not limited to the individual ECU 11a. For example, the integrated ECU 10 may also calculate the wire temperature. The power supply control device that controls power supply is not limited to the individual ECU 11a that communicates with the integrated ECU 10.

The number of sensors that are connected to each of the individual ECU 11a and the plurality of individual ECUs 11b is not limited to one, and may also be two or more. The number of actuators 14 connected to each individual ECU 11b is not limited to one, and may also be two or more.

The switch 30 is not limited to an N-channel FET, and may also be a semiconductor switch other than the N-channel FET. Examples of the semiconductor switch other than the N-channel FET include a P-channel FET, an IGBT (Insulated Gate Bipolar Transistor), a bipolar transistor, and the like.

The first and second embodiments disclosed herein are illustrative in all aspects and should not be considered restrictive. The scope of the present disclosure is indicated by the scope of claims, not the above-mentioned meaning, and is intended to include all modifications within the meaning and scope equivalent to the scope of claims.

The invention claimed is:

1. A power supply control device that controls power supply through a wire, comprising:
 a processing unit configured to execute processing,
 a switch disposed on a current path of current flowing through the wire;
 a switching circuit configured to switch the switch on or off;
 wherein the processing unit causes the switching circuit to perform PWM control in which the switch is alternately switched on and off, wherein a duty ratio of the PWM control is increased so as to increase an average value of a wire current value of a current flowing through the wire in a stepwise manner, and
 every time the average value of a wire current value is increased, determines whether or not an anomaly has occurred in power supply through the wire based on a temperature difference between a wire temperature of the wire and an environmental temperature in an area surrounding the wire.

2. The power supply control device according to claim 1, wherein the processing unit
 acquires the wire current value,
 calculates the temperature difference based on the acquired wire current value, and
 every time the average value of the wire current value is increased, determines whether or not the anomaly has occurred based on a calculated temperature difference.

3. The power supply control device according to claim 2, wherein the switching circuit receives a signal,
 the switching circuit switches the switch on or off according to the received signal,
 the switching circuit, if the wire current value is a current threshold or more, or if the temperature of the switch is a switch temperature threshold or more, switches the switch off irrelevant to the received signal, and
 the processing unit increases the average value of a wire current value in a stepwise manner, after the switching circuit has switched the switch off irrelevant to the received signal.

4. The power supply control device according to claim 2, wherein the processing unit
cuts off a flow of current flowing through the wire, when the wire temperature is a wire temperature threshold or more, and
increases the average value of a wire current value in a stepwise manner, after the wire temperature has increased to a temperature that is the wire temperature threshold or more.

5. The power supply control device according to claim 1, further comprising:
a storage unit that stores a plurality of upper limit values for the temperature difference in association with a plurality of duty ratios regarding the PWM control,
wherein the processing unit determines, every time the average value of a wire current value is increased, whether or not the anomaly has occurred, based on whether or not the temperature difference exceeds an upper limit value associated with a duty ratio in the PWM control performed by the switching circuit.

6. The power supply control device according to claim 5, wherein the processing unit determines, every time the average value of a wire current value is increased, whether or not the anomaly has occurred, based on an amount of increase in the temperature difference that has increased due to the increase in the average value of a wire current value.

7. The power supply control device according to claim 5, wherein the switching circuit receives a signal,
the switching circuit switches the switch on or off according to the received signal,
the switching circuit, if the wire current value is a current threshold or more, or if the temperature of the switch is a switch temperature threshold or more, switches the switch off irrelevant to the received signal, and
the processing unit increases the average value of a wire current value in a stepwise manner, after the switching circuit has switched the switch off irrelevant to the received signal.

8. The power supply control device according to claim 5, wherein the processing unit
cuts off a flow of current flowing through the wire, when the wire temperature is a wire temperature threshold or more, and
increases the average value of a wire current value in a stepwise manner, after the wire temperature has increased to a temperature that is the wire temperature threshold or more.

9. The power supply control device according to claim 1, wherein the processing unit determines, every time the average value of a wire current value is increased, whether or not the anomaly has occurred, based on an amount of increase in the temperature difference that has increased due to the increase in the average value of a wire current value.

10. The power supply control device according to claim 9, wherein the switching circuit receives a signal,
the switching circuit switches the switch on or off according to the received signal,
the switching circuit, if the wire current value is a current threshold or more, or if the temperature of the switch is a switch temperature threshold or more, switches the switch off irrelevant to the received signal, and
the processing unit increases the average value of a wire current value in a stepwise manner, after the switching circuit has switched the switch off irrelevant to the received signal.

11. The power supply control device according to claim 9, wherein the processing unit
cuts off a flow of current flowing through the wire, when the wire temperature is a wire temperature threshold or more, and
increases the average value of a wire current value in a stepwise manner, after the wire temperature has increased to a temperature that is the wire temperature threshold or more.

12. The power supply control device according to claim 1, wherein the switching circuit receives a signal,
the switching circuit switches the switch on or off according to the received signal,
the switching circuit, if the wire current value is a current threshold or more, or if the temperature of the switch is a switch temperature threshold or more, switches the switch off irrelevant to the received signal, and
the processing unit increases the average value of a wire current value in a stepwise manner, after the switching circuit has switched the switch off irrelevant to the received signal.

13. The power supply control device according to claim 12, wherein the processing unit
cuts off a flow of current flowing through the wire, when the wire temperature is a wire temperature threshold or more, and
increases the average value of a wire current value in a stepwise manner, after the wire temperature has increased to a temperature that is the wire temperature threshold or more.

14. The power supply control device according to claim 1, wherein the processing unit
cuts off a flow of current flowing through the wire, when the wire temperature is a wire temperature threshold or more, and
increases the average value of a wire current value in a stepwise manner, after the wire temperature has increased to a temperature that is the wire temperature threshold or more.

15. An in-vehicle control device that controls operations of a load, comprising:
a receiving unit configured to receive instruction data instructing that the load be caused to start or stop operating;
a switch disposed on a current path of current flowing through the wire;
a switching circuit configured to switch the switch on or off;
a processing unit configured to execute processing,
wherein the processing unit
controls power supply to the load through a wire in accordance with instruction data received by the receiving unit,
causes the switching circuit to perform PWM control in which the switch is alternately switched on and off, wherein a duty ratio of the PWM control is increased so as to increase an average value of a wire current value of a current flowing through the wire in a stepwise manner, and
determines, every time the average value of a wire current value is increased, whether or not an anomaly has occurred in power supply through the wire, based on a temperature difference between a wire temperature of the wire and an environmental temperature in an area surrounding the wire.

16. A power supply control method of controlling power supply through a wire that includes steps to be executed by a computer, the method comprising:

providing a switch on the wire, the switch configured to be turned on and off;

a step of increasing, in a stepwise manner, an average value of a wire current value of a current flowing through the wire by increasing a duty ratio of a PWM control of the switch; and a step of determining, every time the average value of a wire current value is increased, whether or not an anomaly has occurred in power supply through the wire, based on a temperature difference between a wire temperature of the wire and an environmental temperature in an area surrounding the wire.

* * * * *